(12) United States Patent
Aoi

(10) Patent No.: US 12,405,601 B2
(45) Date of Patent: Sep. 2, 2025

(54) DISPLAY METHOD AND CONTROL DEVICE

(71) Applicant: Tokyo Electron Limited, Tokyo (JP)

(72) Inventor: Ryota Aoi, Sapporo (JP)

(73) Assignee: Tokyo Electron Limited, Tokyo (JP)

( * ) Notice: Subject to any disclaimer, the term of this patent is extended or adjusted under 35 U.S.C. 154(b) by 384 days.

(21) Appl. No.: 17/678,477

(22) Filed: Feb. 23, 2022

(65) Prior Publication Data

US 2022/0283572 A1 Sep. 8, 2022

(30) Foreign Application Priority Data

Mar. 3, 2021 (JP) ................................. 2021-033651

(51) Int. Cl.
| | |
|---|---|
| G05B 19/41 | (2006.01) |
| C23C 16/52 | (2006.01) |
| G05B 19/418 | (2006.01) |
| G06F 3/04847 | (2022.01) |
| H01J 37/32 | (2006.01) |
| H01L 21/677 | (2006.01) |

(52) U.S. Cl.
CPC ........ G05B 19/41865 (2013.01); C23C 16/52 (2013.01); G06F 3/04847 (2013.01); H01J 37/32935 (2013.01); *G05B 2219/34379* (2013.01); *H01L 21/67739* (2013.01)

(58) Field of Classification Search
CPC .... G05B 19/41865; G05B 2219/31467; G05B 2219/45031; G05B 19/4184; G05B 23/02; G05B 2219/34379; C23C 16/52; C23C 16/345; C23C 16/45542; C23C 16/45546; C23C 16/507; H01L 21/67253; H01L 21/67276; H01L 21/67739; H01J 37/32935; G06F 3/04847
See application file for complete search history.

(56) References Cited

U.S. PATENT DOCUMENTS

| | | | | |
|---|---|---|---|---|
| 6,567,718 | B1 * | 5/2003 | Campbell | G05B 19/4184 700/121 |
| 6,957,114 | B1 * | 10/2005 | Logsdon | G06Q 10/0631 700/121 |
| 7,043,317 | B1 * | 5/2006 | Rust | G05B 19/41865 700/121 |
| 2003/0154001 | A1 * | 8/2003 | Oh | G05B 19/41865 700/217 |

(Continued)

FOREIGN PATENT DOCUMENTS

| | | |
|---|---|---|
| JP | H11-297785 A | 10/1999 |
| JP | 2003-037148 A | 2/2003 |
| JP | 2013-008834 A | 1/2013 |

*Primary Examiner* — Christopher W Carter
(74) *Attorney, Agent, or Firm* — Venjuris, P.C.

(57) ABSTRACT

A display method includes storing, in a storage unit, first history information in which a processing is executed by a substrate processing apparatus based on a recipe; storing, in the storage unit, second history information in which an execution instruction for a job is received to instruct execution of the processing; and calculating, based on the first history information and the second history information, a first idle time indicating a time during which the processing is not performed and a second idle time indicating a time from an end of the job to a start of execution of a next job, and displaying the first idle time and the second idle time.

10 Claims, 8 Drawing Sheets

(56) References Cited

U.S. PATENT DOCUMENTS

| | | | |
|---|---|---|---|
| 2003/0174154 A1* | 9/2003 | Yukie | H04N 21/6131 |
| | | | 348/E7.071 |
| 2004/0243268 A1* | 12/2004 | Hsieh | G06Q 10/06 |
| | | | 700/108 |
| 2005/0119863 A1* | 6/2005 | Buikema | G05B 19/4184 |
| | | | 702/188 |
| 2008/0228306 A1* | 9/2008 | Yetter | G05B 23/0254 |
| | | | 700/109 |
| 2014/0067110 A1* | 3/2014 | Lawson | H01L 21/67276 |
| | | | 700/117 |
| 2016/0147219 A1* | 5/2016 | Siddiqui | G05B 19/41865 |
| | | | 700/101 |

\* cited by examiner

FIG. 6

| END CONDITION | PJID | PROCESS RECIPE NAME | PROCESSING START TIME | PROCESSING END TIME | EXECUTION TIME | IDLE TIME A | IDLE TIME B | IDLE TIME C |
|---|---|---|---|---|---|---|---|---|
| Normal End | PJID_51 | main/PROCESS_LOG/PROCESS_A | 2020/11/08 09:18:14 | 2020/11/08 09:19:50 | 0:01:36 | 1:40:02 | 0:59:33 | 0:00:00 |
| Normal End | PJID_50 | main/PROCESS_LOG/PROCESS_A | 2020/11/08 07:36:36 | 2020/11/08 07:38:12 | 0:01:35 | 0:00:02 | 0:00:00 | 0:00:00 |
| Normal End | PJID_50 | main/PROCESS_LOG/PROCESS_A | 2020/11/08 07:34:58 | 2020/11/08 07:36:34 | 0:01:35 | 0:00:02 | 0:00:00 | 0:00:00 |
| Normal End | PJID_50 | main/PROCESS_LOG/PROCESS_A | 2020/11/08 07:33:20 | 2020/11/08 07:34:56 | 0:01:35 | 0:00:02 | 0:00:00 | 0:00:00 |
| Normal End | PJID_50 | main/PROCESS_LOG/PROCESS_A | 2020/11/08 07:31:41 | 2020/11/08 07:33:18 | 0:01:36 | 0:00:01 | 0:00:00 | 0:00:00 |
| Normal End | PJID_50 | main/PROCESS_LOG/PROCESS_A | 2020/11/08 07:30:03 | 2020/11/08 07:31:40 | 0:01:36 | 0:00:01 | 0:00:00 | 0:00:00 |
| Normal End | PJID_50 | main/PROCESS_LOG/PROCESS_A | 2020/11/08 07:28:26 | 2020/11/08 07:30:01 | 0:01:35 | 1:50:48 | 1:03:10 | 0:29:15 |
| Normal End | PJID_09 | main/PROCESS_LOG/PROCESS_A | 2020/11/08 05:36:02 | 2020/11/08 05:37:38 | 0:01:36 | 0:00:02 | 0:00:00 | 0:00:00 |
| Normal End | PJID_09 | main/PROCESS_LOG/PROCESS_A | 2020/11/08 05:34:24 | 2020/11/08 05:36:00 | 0:01:36 | 0:00:02 | 0:00:00 | 0:00:00 |
| Normal End | PJID_09 | main/PROCESS_LOG/PROCESS_A | 2020/11/08 05:32:44 | 2020/11/08 05:34:21 | 0:01:36 | 0:00:02 | 0:00:00 | 0:00:00 |
| Normal End | PJID_09 | main/PROCESS_LOG/PROCESS_A | 2020/11/08 05:31:05 | 2020/11/08 05:32:42 | 0:01:36 | 0:00:02 | 0:00:00 | 0:00:00 |

DISPLAY METHOD AND CONTROL DEVICE

CROSS-REFERENCE TO RELATED APPLICATIONS

This application is based on and claims priority from Japanese Patent Application No. 2021-033651, filed on Mar. 3, 2021 with the Japan Patent Office, the disclosure of which is incorporated herein in its entirety by reference.

TECHNICAL FIELD

The present disclosure relates to a display method and a control device.

BACKGROUND

A substrate processing apparatus performs a variety of processings on a wafer such as a film forming processing, etching processing, oxidation diffusion processing, annealing processing, and modification processing. The substrate processing apparatus charges (loads) a processing container with a plurality of wafers, and starts a substrate processing when the condition in the processing container is satisfied.

It has been known in the substrate processing apparatus that the time during which wafers stay in a stocker may have an influence on the substrate quality (see, e.g., Japanese Patent Laid-Open Publication No. 2003-037148). Japanese Patent Laid-Open Publication No. 2003-037148 discloses a processing system capable of managing the wafer stay time for each cassette and issuing an appropriate alarm.

SUMMARY

In view of the above, the present disclosure provides a display method of displaying information regarding a history of execution by a substrate processing apparatus that executes a desired processing, the display method including storing, in a storage unit, first history information in which a processing is executed by a substrate processing apparatus based on a recipe, storing, in the storage unit, second history information in which an execution instruction for a job is received to instruct execution of the processing, and calculating, based on the first history information and the second history information, a first idle time during which the processing is not performed and a second idle time from an end of the job to a start of execution of a next job and displaying the first idle time and the second idle time.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a diagram illustrating a display example of idle times according to the present disclosure.

DESCRIPTION OF EMBODIMENT

Figure 1:
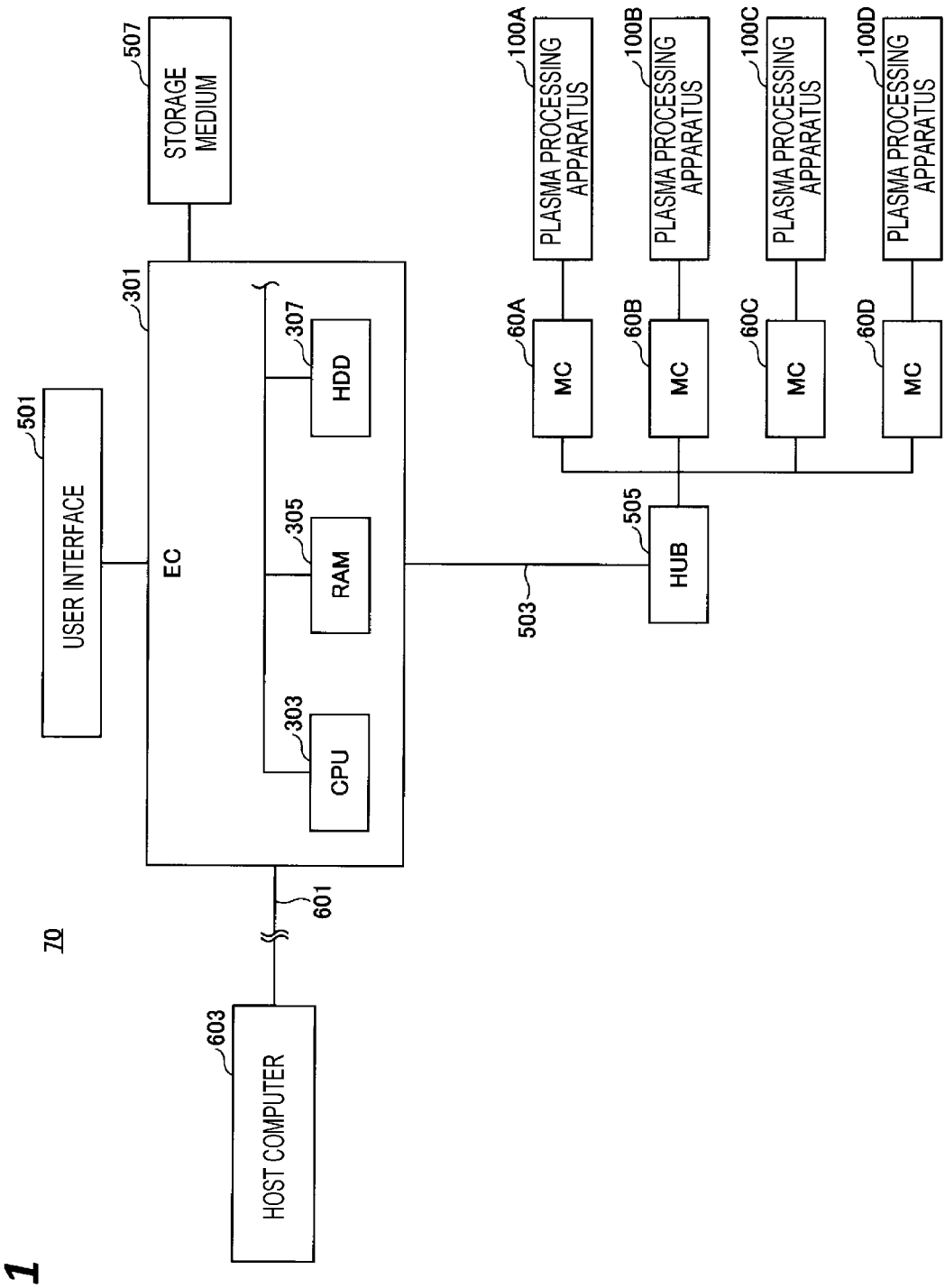
FIG. 1 is a diagram illustrating a control system of a plasma processing apparatus according to the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. The same or corresponding reference numerals will be given to the same or corresponding members or parts throughout the attached drawings, and redundant descriptions thereof will be omitted.

[System Configuration Example]

FIG. 1 illustrates a control system 70 of a plasma processing apparatus according to the present disclosure. The control system 70 performs the overall control in plasma processing apparatuses 100A to 100D (hereinafter, any plasma processing apparatus will be referred to as "plasma processing apparatus 100" in some cases). The plasma processing apparatus 100 will be described in detail with reference to FIGS. 2 and 3.

As illustrated in FIG. 1, the control system 70 includes, as major components, four module controllers (MCs) 60A, 60B, 60C, and 60D (hereinafter, referred to as "MC 60" in some cases) which are an example of individual controllers provided to correspond to the plasma processing apparatus 100, an equipment controller (EC) 301 which controls the entire plasma processing apparatus 100, and a user interface 501 connected to the EC 301. The MC 60 is deployed in the plasma processing apparatus 100. The MC 60 may be deployed in, for example, a load lock chamber (not illustrated). These are also collectively controlled by the EC 301, but the illustration and description thereof will be omitted herein. The EC 301 and the MC 60 are an example of a control device.

The EC 301 and each MC 60 are connected to each other by an in-system local area network (LAN) 503, and the EC 301 and each MC 60 may communicate with each other. The in-system LAN 503 has a switching HUB 505. The switching HUB 505 performs switching between the MC 60A to the MC 60D as connection destinations of the EC 301 in response to a control signal from the EC 301.

The EC 301 is an integrated controller that collectively controls each MC 60 to control operations of the entire plasma processing apparatus 100. The EC 301 includes a central processing unit (CPU) 303, a RAM 305 as a volatile memory, and a hard disk device (HDD) 307 as a storage unit. The storage unit is not limited to the hard disk device 307, and other non-volatile memories may be used.

Further, the EC 301 is connected to a host computer 603 as a manufacturing execution system (MES) that manages manufacturing processes of the entire factory in which the plasma processing apparatus 100 is provided via a LAN 601. The host computer 603 feeds real-time information related to various processes in the factory back to a core business system (not illustrated) in cooperation with the control system 70, and determines the processes in consideration of, for example, the load of the entire factory.

Further, the user interface 501 is connected to the EC 301. The user interface 501 includes a keyboard by which a process manager performs an input operation of commands for managing the plasma processing apparatus 100, a display which visualizes and displays the operating status of the plasma processing apparatus 100, and a mechanical switch which issues a command to the EC 301.

The EC 301 is adapted to be able to record information on a computer readable storage medium (hereinafter, simply referred to as a "storage medium") 507 and to read the information from the storage medium 507. A control program and a recipe, which are used for a substrate processing by the EC 301, may be used, for example, by installing those stored in the storage medium 507 to the hard disk device 307 as the storage unit. The recipe stores a procedure for manufacturing a semiconductor. In particular, for example, a recipe in which conditions (e.g., temperature, pressure, gas type, gas flow rate, and time) are stored to allow the plasma processing apparatus 100 to execute a desired processing (process) is referred to as a "process recipe."

The storage medium 507 may be, for example, a CD-ROM, a hard disk, a flexible disk, a flash memory, or a DVD. Further, the EC 301 may also use the above recipe by downloading it from another device such as a server via a network.

In the EC 301, the CPU 303 reads a program (software) including a recipe indicating a procedure of a charge, a process (e.g., a film forming process), and a discharge (including cooling), and a process recipe from the hard disk device 307 or the storage medium 507. Then, the EC 301 causes each MC 60 to control each part of the plasma processing apparatuses 100A to 100D based on the read recipe and the process recipe.

The MC 60 is provided as an individual controller that controls an operation of each of the plasma processing apparatuses 100A to 100D. The MC 60A, the MC 60B, the MC 60C, and the MC 60D individually control the plasma processing apparatus 100A, the plasma processing apparatus 100B, the plasma processing apparatus 100C, and the plasma processing apparatus 100D, respectively.

[Plasma Processing Apparatus]

Figure 2:
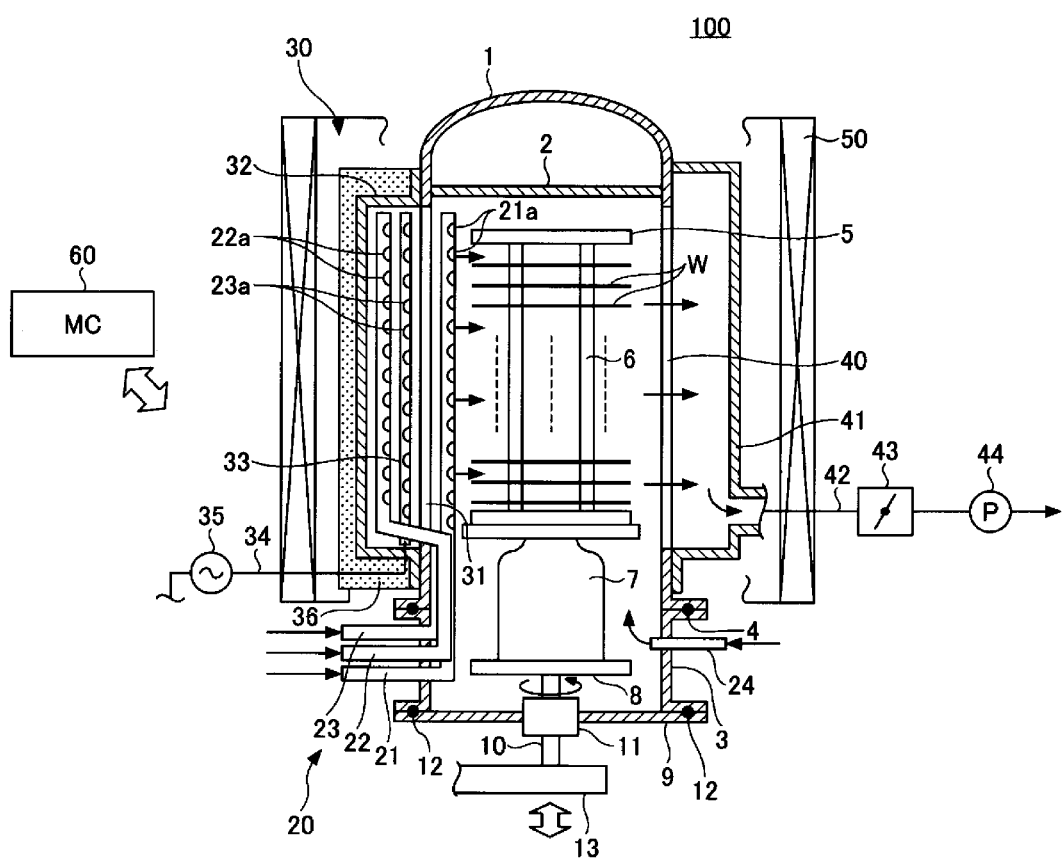
FIG. 2 is a cross-sectional view schematically illustrating an example of the plasma processing apparatus according to the present disclosure.
Figure 3:
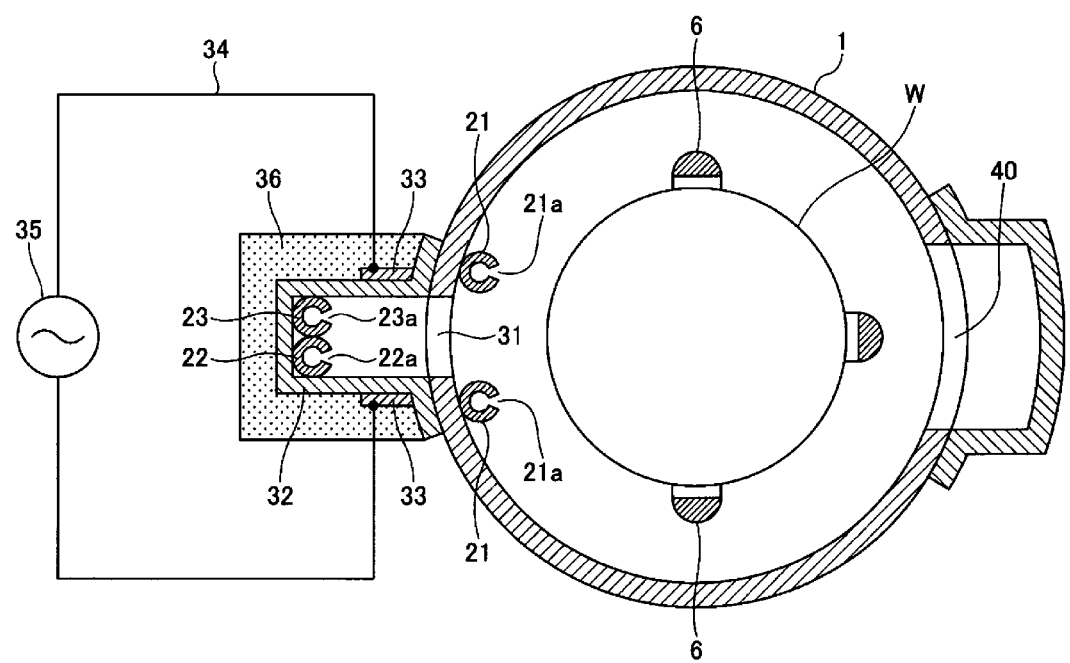
FIG. 3 is a cross-sectional view of a processing container of the plasma processing apparatus according to the present disclosure as viewed from a horizontal plane.

A configuration example of the plasma processing apparatus 100 will be described with reference to FIGS. 2 and 3. FIG. 2 is a cross-sectional view schematically illustrating an example of the plasma processing apparatus 100 according to the present disclosure.

The plasma processing apparatus 100 has a cylindrical processing container 1 with a ceiling having an open lower end. The entire processing container 1 is formed of, for example, quartz. A ceiling plate 2 formed of quartz is provided in the vicinity of the upper end of the processing container 1, and a region under the ceiling plate 2 is sealed. A metallic manifold 3 shaped into a cylinder is connected to an opening in the lower end of the processing container 1 via a sealing member 4 such as an O-ring.

The manifold 3 supports the lower end of the processing container 1, and a boat 5 on which a large number (e.g., 25 to 150) of wafers W are placed in multiple tiers is inserted into the processing container 1 from below the manifold 3. In this way, the large number of wafers W are accommodated substantially horizontally at an interval therebetween along the vertical direction inside the processing container 1. The boat 5 is formed of, for example, quartz. The boat 5 has three rods 6 (see FIG. 3), and the large number of wafers W are supported by grooves (not illustrated) formed in the rods 6. The wafer W may be, for example, a semiconductor wafer. Further, the wafer W is referred to as "substrate" in some cases.

The boat 5 is placed on a table 8 via a heat insulating cylinder 7 formed of quartz. The table 8 is supported on a rotation shaft 10 penetrating a metallic (stainless steel) lid 9 which opens and closes an opening in the lower end of the manifold 3.

A magnetic fluid seal 11 is provided around a penetrating portion of the rotation shaft 10 and configured to airtightly seal and rotatably support the rotation shaft 10. A sealing member 12 is provided between a peripheral portion of the lid 9 and the lower end of the manifold 3 to maintain the airtightness in the processing container 1.

The rotation shaft 10 is attached to the tip of an arm 13 supported by an elevating mechanism (not illustrated) such as a boat elevator, and the boat 5 and the lid 9 integrally move up and down, and are inserted into and removed from the processing container 1. The table 8 may be fixedly provided on the lid 9 side, such that the wafer W may be processed without rotating the boat 5.

The plasma processing apparatus 100 has a gas supply 20 that supplies a predetermined gas such as a processing gas and a purge gas into the processing container 1.

The gas supply 20 has gas supply pipes 21 to 24. The gas supply pipes 21 to 23 are formed of, for example, quartz, inwardly penetrate the sidewall of the manifold 3, bend upward, and extend vertically. A plurality of gas holes 21a to 23a are formed at a predetermined interval in a vertical portion of the gas supply pipes 21 to 23, respectively, over the vertical length corresponding to the substrate support range of the boat 5. Each of the gas holes 21a to 23a discharges a gas in the horizontal direction. The gas supply pipe 24 is formed of, for example, quartz, and includes a short quartz pipe provided to penetrate the sidewall of the manifold 3. In the illustrated example, two gas supply pipes 21 are provided, while the gas supply pipes 22 to 24 are provided one each.

The gas supply pipe 21 has a vertical portion provided inside the processing container 1. For example, trisilylamine (TSA) (($SiH_3$)$_3$N) is supplied from a raw material gas source to the gas supply pipe 21 via a gas pipe. The gas pipe is provided with a flow rate controller and an on-off valve. Thus, the TSA is supplied at a predetermined flow rate from the raw material gas source into the processing container 1 via the gas pipe and the gas supply pipe 21.

The gas supply pipe 22 has a vertical portion provided in a plasma generation space to be described later. Ammonia ($NH_3$) gas is supplied from an ammonia gas source to the gas supply pipe 22 via a gas pipe. The gas pipe is provided with a flow rate controller and an on-off valve. Thus, the $NH_3$ gas is supplied at a predetermined flow rate from the ammonia gas source to the plasma generation space via the gas pipe and the gas supply pipe 22. The $NH_3$ gas is converted into a plasma in the plasma generation space and is supplied into the processing container 1. Further, hydrogen ($H_2$) gas is supplied from a hydrogen gas source to the gas supply pipe 22 via a gas pipe. The gas pipe is provided with a flow rate controller and an on-off valve. Thus, the $H_2$ gas is supplied at a predetermined flow rate from the hydrogen gas source to the plasma generation space via the gas pipe and the gas supply pipe 22. The $H_2$ gas is converted into a plasma in the plasma generation space and is supplied into the processing container 1.

The gas supply pipe 23 has a vertical portion provided in the plasma generation space to be described later. Chlorine ($Cl_2$) gas is supplied from a chlorine gas source to the gas supply pipe 23 via a gas pipe. The gas pipe is provided with a flow rate controller and an on-off valve. Thus, the $Cl_2$ gas is supplied at a predetermined flow rate from the chlorine gas source to the plasma generation space via the gas pipe and the gas supply pipe 23. The $Cl_2$ gas is converted into a plasma in the plasma generation space and is supplied into the processing container 1.

A purge gas is supplied from a purge gas source to the gas supply pipe 24 via a gas pipe. The gas pipe is provided with a flow rate controller and an on-off valve. Thus, the purge gas is supplied at a predetermined flow rate from the purge gas source into the processing container 1 via the gas pipe and the gas supply pipe 24. The purge gas may be, for example, an inert gas such as nitrogen ($N_2$) or argon (Ar). The purge gas may be supplied from at least one of the gas supply pipes 21 to 23.

A plasma generation mechanism 30 is formed on a part of the sidewall of the processing container 1. The plasma generation mechanism 30 forms a plasma from the $NH_3$ gas to generate an active species for nitrification. The plasma generation mechanism 30 forms a plasma from the $H_2$ gas to generate hydrogen (H) radicals. The plasma generation mechanism 30 forms a plasma from the $Cl_2$ gas to generate chlorine (Cl) radicals.

The plasma generation mechanism 30 includes a plasma partition 32, a pair of plasma electrodes 33, a feeding line 34, an RF power supply 35, and an insulating protective cover 36.

The plasma partition 32 is airtightly welded to the outer wall of the processing container 1. The plasma partition 32 is formed of, for example, quartz. The plasma partition 32 has a concave cross section and covers an opening 31 formed in the sidewall of the processing container 1. The opening 31 is elongated in the vertical direction so as to cover all of the wafers W supported by the boat 5 in the vertical direction. The gas supply pipes 22 and 23 are arranged in the inner space, i.e., the plasma generation space, which is defined by the plasma partition 32 and communicates with the inside of the processing container 1. The gas supply pipe 21 is provided at a position close to the wafers W along the inner sidewall of the processing container 1 outside the plasma generation space. In the illustrated example, two gas supply pipes 21 are arranged at positions sandwiching the opening 31, but the present disclosure is not limited thereto, and, for example, only one of the two gas supply pipes 21 may be arranged.

The pair of plasma electrodes 33 each have an elongated shape, and are arranged so as to face each other along the vertical direction on opposite outer wall surfaces of the plasma partition 32. The feeding line 34 is connected to the lower end of each plasma electrode 33.

The feeding line 34 electrically connects each plasma electrode 33 and the RF power supply 35 to each other. In the illustrated example, the feeding line 34 is connected at one end thereof to the lower end of each plasma electrode 33 which is a side portion of the short side thereof and at the other end thereof to the RF power supply 35.

The RF power supply 35 is connected to the lower end of each plasma electrode 33 via the feeding line 34, and supplies RF power of, for example, 13.56 MHz to the pair of plasma electrodes 33. Thus, the RF power is applied to the plasma generation space defined by the plasma partition 32. The $NH_3$ gas discharged from the gas supply pipe 22 is converted into a plasma in the plasma generation space to which the RF power has been applied, and the thus generated active species for nitrification is supplied to the inside of the processing container 1 through the opening 31. The $H_2$ gas discharged from the gas supply pipe 22 is converted into plasma in the plasma generation space to which the RF power has been applied, and the thus generated hydrogen radicals are supplied to the inside of the processing container 1 through the opening 31. The $Cl_2$ gas discharged from the gas supply pipe 23 is converted into a plasma in the plasma generation space to which the RF power has been applied, and the thus generated chlorine radicals are supplied to the inside of the processing container 1 through the opening 31.

The insulating protective cover 36 is attached to the outer side of the plasma partition 32 to cover the plasma partition 32. A coolant passage (not illustrated) is formed in an inner portion of the insulating protective cover 36, and the plasma electrode 33 is cooled by flowing a coolant such as cooled $N_2$ gas through the coolant passage. A shield (not illustrated) may be provided between the plasma electrode 33 and the insulating protective cover 36 to cover the plasma electrode 33. The shield is formed of a good conductor such as a metal, and is grounded.

An exhaust port 40 is formed in a sidewall portion of the processing container 1 facing the opening 31 for vacuum evacuation of the inside of the processing container 1. The exhaust port 40 is vertically elongated to correspond to the boat 5. An exhaust port cover member 41 having a U-shaped cross section is attached to a portion of the processing container 1 corresponding to the exhaust port 40 to cover the exhaust port 40. The exhaust port cover member 41 extends upward along the sidewall of the processing container 1. An exhaust pipe 42 is connected to a lower portion of the exhaust port cover member 41 to evacuate the processing container 1 via the exhaust port 40. An exhaust device 44 which includes a pressure control valve 43 for the control of the pressure inside the processing container 1 and a vacuum pump is connected to the exhaust pipe 42, and the inside of the processing container 1 is evacuated by the exhaust device 44 via the exhaust pipe 42.

A cylindrical heating mechanism 50 is provided around the processing container 1. The heating mechanism 50 heats the processing container 1 and the wafers W inside thereof. The term "charge" as used herein refers that the boat 5 on which the wafers W are placed in multiple tiers is accommodated into the processing container 1 by an elevating mechanism. After charge, a film forming processing is performed by supplying a desired gas and heating the wafers W. Thereafter, cooling is executed to cool the wafers W heated during the processing, and the boat 5 is lowered by the elevating mechanism to take the wafers W out of the processing container 1. The term "discharge" as used herein refers that the wafers W are cooled and the boat 5 is taken out of the processing container 1. A procedure of charge→process recipe execution (a processing of the wafers W)→discharge (including cooling) is set in advance by a recipe, and among other things, the processing of the wafers W is executed according to a procedure set in a process recipe.

In the present disclosure, the logs of the start and end of each process of charge→process recipe execution→discharge are stored as first history information. That is, the first history information is an example of log information related to a process, and includes information regarding a history of executing a substrate charge, a substrate processing, and a substrate discharge, which are performed by the plasma processing apparatus 100. The first history information is stored in, for example, the EC 301.

The processing of the wafers W performed by an instruction for process recipe execution is an example of a processing executed by a substrate processing apparatus. The processing executed by the substrate processing apparatus includes any processing performed by the plasma processing apparatus 100 such as various wafer processings such as a film forming processing and an etching processing and a cleaning processing in the processing container 1.

In the present disclosure, for example, the MC 60 controls an operation of each part of the plasma processing apparatus 100, thereby controlling a film forming processing executed by the plasma processing apparatus 100. The MC 60 may be, for example, a computer. A computer program that implements an operation of each part of the plasma processing apparatus 100 is stored in a storage medium. The storage medium may be, for example, a flexible disk, a compact disk, a hard disk, a flash memory, or a DVD.

The MC 60 executes the charge, the processing of the wafers W, and the discharge with respect to one lot of the wafers W requested to be executed from the EC 301 based on a recipe and a process recipe stored in the EC 301. Hereinafter, these including the process recipe are also referred to as a "recipe."

The MC 60 notifies the EC 301 of the logs of the start/end of the processing of the wafers W placed in multiple tiers on the boat 5, executed based on the recipe, i.e., the processing for one lot, the start/end of charge, the start/end of the execution of a wafer processing, and the start/end of discharge. Further, the MC 60 notifies the EC 301 of the device name of the plasma processing apparatus 100, the end condition (the presence/absence of abnormalities), the process job ID, and the process recipe name. Accordingly, in the EC 301, detailed logs (history information) regarding any operation performed by the plasma processing apparatus 100 as well as the processing of the wafers W and may be recorded in a storage unit such as the RAM 305. However, the MC 60 itself may record the logs in its own storage unit, or both the EC 301 and the MC 60 may record the logs.

Meanwhile, the EC 301 receives an "an execution instruction for a job" which is transmitted from the host computer 603 to instruct the plasma processing apparatus 100 to execute the job. The execution instruction for a job instructs the execution of a processing for one lot of the wafers W, but one lot may include one or a plurality of wafers W, and the number of wafers W to be processed at one time is not limited. The received execution instruction for a job is received by the MC 60 which controls any one plasma processing apparatus 100 by way of the EC 301 and the HUB 505. The MC 60 which has received the execution instruction for a job starts the execution of a job for one lot, and accordingly, the plasma processing apparatus 100 executes the charge, the processing of the wafers W, and the discharge based on the recipe. In the present disclosure, the log of the execution instruction for a job is stored as second history information.

Furthermore, the EC 301 receives an "execution instruction for a control job" which is transmitted from the host computer 603 to instruct the plasma processing apparatus 100 to collectively execute a plurality of jobs. The execution instruction for a control job is received by the MC 60 which controls any one plasma processing apparatus 100 by way of the EC 301 and the HUB 505. The MC which has received the execution instruction for a control job starts the execution of jobs for a plurality of lots, and in response to this, the plasma processing apparatus 100 executes the charge, the processing of the wafers W, and the discharge for the plurality of lots based on the recipe. In the present disclosure, the log of the execution instruction for a control job is stored as third history information.

That is, the second history information and the third history information are examples of log information related to the system, and are stored in, for example the EC 301. The second history information includes information regarding a history of receiving the execution instruction for a job from an external computer such as the host computer 603, and the third history information includes information regarding a history of receiving the execution instruction for a control job from the external computer. The third history information may not be stored.

[About Idle Time]

Next, an idle time will be explained. The idle time may generally be the time during which a process or system is not running, but a plurality of different idle times may be defined from various viewpoints. Then, it has been known that the idle time greatly affects the processing quality of the wafers W. As an example, it is required that the condition in the processing container when the plasma processing apparatus 100 starts the process recipe is substantially the same in the same process. However, when the idle time before the wafer processing is long in a certain plasma processing apparatus 100, the condition in the processing container of that apparatus may fluctuate, which may deteriorate the quality of the processed wafers W.

In such a case, by monitoring the idle time, a user may easily investigate the fact that the processing quality of the wafers W is deteriorated and the cause of this deterioration. However, in order for the user to know the idle time until now, the user himself/herself has needed to read the log of the plasma processing apparatus 100 with spreadsheet software and to calculate the idle time by operating a computer.

Therefore, the present disclosure proposes a display method in which several types of idle times are defined as follows, and a plurality of idle times is displayed and presented to the user. Further, the method also includes the ability to display only the idle time selected by the user. The plurality of idle times may be displayed on the EC 301, each MC 60, or a monitor connectable to the EC 301 or each MC 60.

(i) Idle time between process recipe executions (an example of a first idle time)
(ii) Idle time between jobs for one lot (an example of a second idle time)
(iii) Idle time between multiple jobs for N lots, i.e., control jobs (an example of a third idle time)

The plasma processing apparatus 100 of the present disclosure is a so-called batch processing type plasma processing apparatus 100 that simultaneously processes a large number (e.g., 25 to 150) of wafers W at one time in parallel with each other, but the idle times are also similarly defined in a single wafer type plasma processing apparatus 100.

Figure 4:
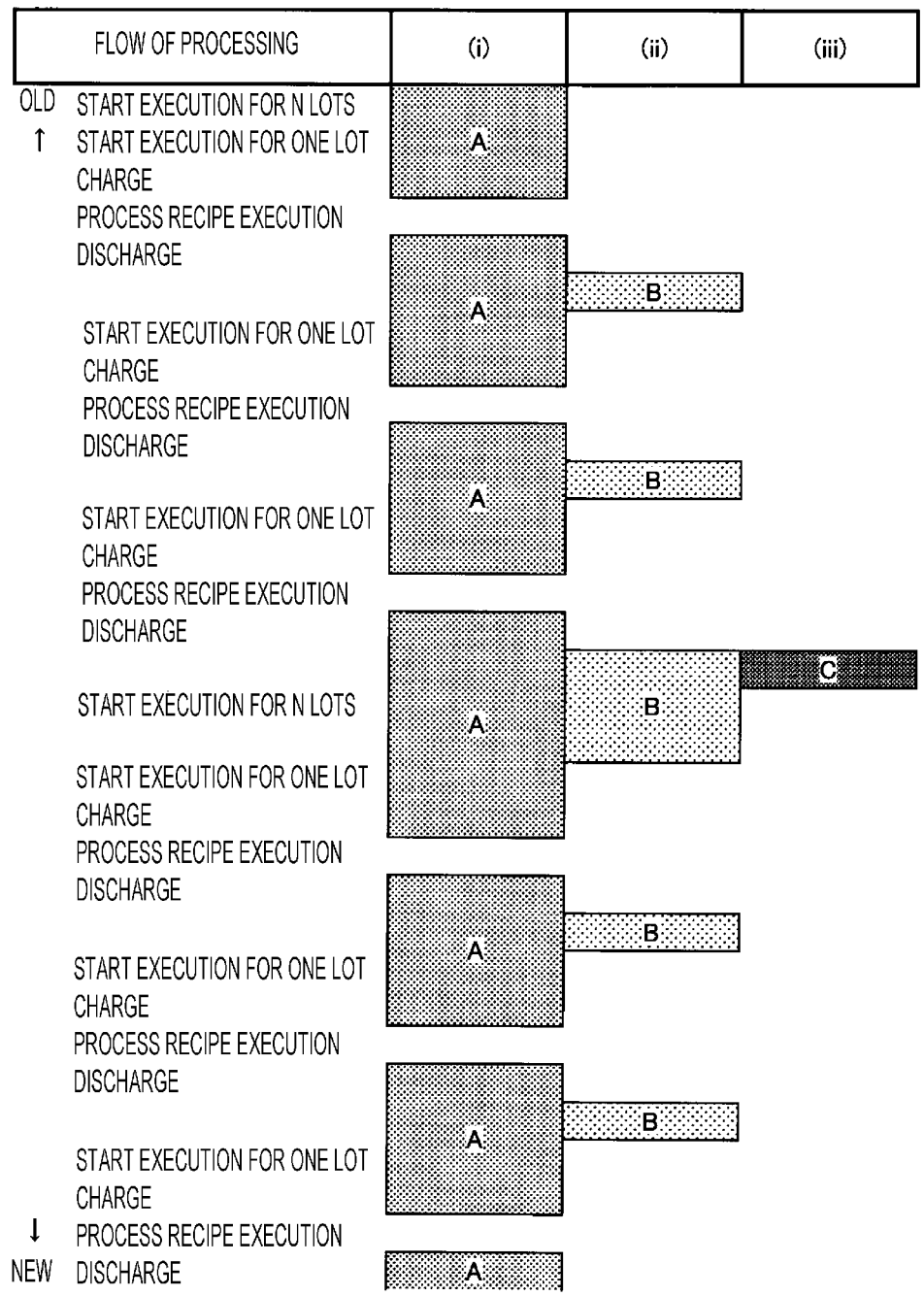
FIG. 4 is an example of a diagram for explaining each idle time according to the present disclosure.

FIG. 4 is an example of a diagram for explaining each idle time. In FIG. 4, the vertical direction represents the passage of time, and the time passes from the top to the bottom.

(i) Idle Time Between Process Recipe Executions A

The idle time between process recipe executions is an elapsed time of the end to the start of one process (time between previous and next processes). That is, the idle time is an elapsed time from the end time of an immediately preceding process to the start time of a next process. One example is from the time at which one process ends to the time at which a next process starts under the control of the MC 60.

According to the definition of the idle time between process recipe executions, the time indicated by reference character A in FIG. 4 is the idle time between process recipe executions, excluding during the execution of the process recipe. The idle time A may be calculated from the first history information. One process may include only one step, or may include a plurality of steps. One process may be, for example, a process of processing the wafers W, and may be one or a combination of a film forming step, a cleaning step, an etching step, an oxidation diffusion step, an annealing step, and a modification step.

Since the condition in the processing container (chamber condition) greatly affects the substrate quality, displaying the idle time between process recipe executions A to the user enables the user to use the idle time A to investigate the cause of a trouble.

Further, when the process recipe includes a processing using a plasma, the idle time A may be the time from plasma excitation OFF to next plasma excitation ON. The "plasma excitation OFF" refers to the timing at which the supply of RF power from the RF power supply 35 to the plasma electrode 33 stops based on the process recipe, and the "next plasma excitation ON" refers to the timing at which the RF power is supplied from the RF power supply 35 to the plasma electrode 33 based on the process recipe.

(ii) Idle Time Between Jobs for One Lot B

The idle time between jobs for one lot is an idle time in a case where one job is defined as being from the start of charge to the end of discharge for one lot of the wafers W. This one job includes charge, process recipe execution, and discharge. The charge includes the time taken to make the condition in the processing container be suitable for the process recipe execution. The discharge includes cooling in the processing container. Thus, the idle time between jobs for one lot is a time after the MC 60 notifies the EC 301 of the end of a job due to the end of discharge for a previous lot of the wafers W and before the start for a next lot (e.g., before the MC 60 receives the start of a job from the EC 301). However, when the MC 60 performs the control of display according to the present disclosure instead of the EC 301, the idle time between jobs for one lot is a time after the MC 60 stores the log of the end of discharge for a previous lot of the wafers W and before the start for a next lot (e.g., before the MC 60 receives the start of a job from the EC 301).

In a case of the batch processing type plasma processing apparatus 100, it may process a large number of wafers W in one lot. Accordingly, the idle time between jobs for one lot is a free time of the focused plasma processing apparatus 100 between a lot processing and a lot processing.

According to the definition of the idle time between jobs for one lot, the time indicated by reference character B in FIG. 4 is the idle time between jobs for one lot, excluding during the execution of jobs. The idle time B may be calculated from the second history information.

In the example of FIG. 4, the third idle time B is significantly longer than the other idle times B. Therefore, displaying the idle time B to the user enables the user to estimate that some trouble may occur before or after the third idle time B from the transition of the idle time B.

(iii) Idle Time Between Multiple Jobs for N Lots C

The idle time between multiple jobs (control jobs) for N lots is a free time of the system after the plasma processing apparatus 100 ends a processing for N lots of the wafers W and before starting a processing for next N lots of the wafers W. Accordingly, the idle time between multiple jobs for N lots is, for example, the time from the end of discharge for the last lot of the wafers W among previous N lots (notification of the end of a job from the MC 60 to the EC 301) to the start of the execution for next N lots (e.g., a user operation to start the execution for N lots).

According to the definition of the idle time between multiple jobs for N lots, the time indicated by reference character C, which is a time after the execution of a process for N lots ends and before an instruction to start the execution of a process for next N lots is made, is the idle time between multiple jobs for N lots. The idle time C may be calculated from the third history information.

The idle time A may be used to investigate the cause of a trouble in the process such as the process being delayed due to some problem. Further, the idle time B or the idle time C may be used to investigate the cause of a trouble in the system such as the request of a job from the host computer 603 or the EC 301 being delayed due to some problem.

Further, the idle times B and C may serve as a throughput criterion. For example, assuming that the plasma processing apparatus 100 originally capable of processing 10 lots per day has processed only 8 lots, the idle time between multiple jobs for N lots C or the idle time between jobs for one lot B is available to investigate the cause of such a decrease in throughput.

[Selection of Idle Time to be Displayed]

Figure 5:
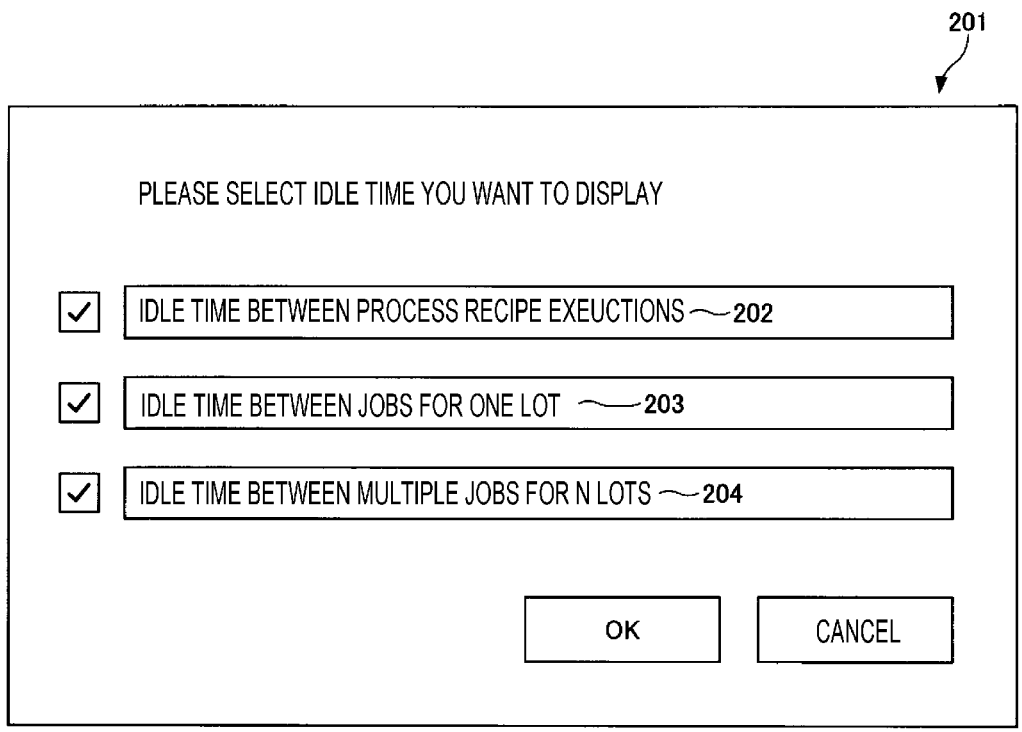
FIG. 5 is a diagram illustrating an example of a selection screen displayed by an EC according to the present disclosure.

The user may select the idle time to be displayed from among three idle times on a selection screen 201 as illustrated in FIG. 5. FIG. 5 is an example of the selection screen 201 displayed by the EC 301. On the selection screen 201, three types of idle times 202 to 204 are displayed together with a message "Please select the idle time you want to display." A check button is displayed in association with each type of idle time.

[Display Example of Idle Time]

The user may input the idle time the user wants to display to the E301 by selecting one or more check buttons. The EC 301 may display the selected one or more idle times.

FIG. 6 is a diagram illustrating a display example of the idle times. The screen of FIG. 6 is a log display screen. In each line of FIG. 6, the time passes from the bottom to the top. In the present disclosure, the EC 301 displays the idle times on a log screen 210. The idle times may be displayed independently of the log screen 210, or the idle times may be displayed in another screen.

The processing described above may be performed primarily by the EC 301, or may be performed primarily by the MC 60. Alternatively, the EC 301 may execute a part of the processing and the MC 60 may execute the remaining processing. The EC 301 or the MC 60 does not directly display the idle times, but any terminal device may display the idle times with a Web browser based on, for example, log information transmitted from the EC 301 to a server.

The log screen 210 has respective items including an end condition 211, a process job ID 212, a process recipe name 213, a processing start time 214, a processing end time 215, an execution time 216, an idle time A 217, an idle time B 218, and an idle time C 219. Each item is described as follows.

The end condition 211 indicates whether or not a process has ended normally. When there is an abnormality, for example, an abnormality code may be displayed.

The process job ID 212 is identification information for the identification of a job for one lot. When the process job ID is the same, the process recipe is also the same.

However, even when the process recipe is the same, the process job ID may be different. In FIG. 6, jobs with the process job ID=09, 50, 51 are executed. A series of jobs with the same process job ID correspond to N lots.

The process recipe name 213 is a name of the process recipe executed by the plasma processing apparatus 100. For example, it may be the file name of the process recipe.

The processing start time 214 is a time at which the MC 60 starts the execution of a process. When a substrate processing includes a processing using a plasma, the time of plasma excitation ON is recorded.

The processing end time 215 is a time at which the MC 60 ends the execution of a process. When a substrate processing includes a processing using a plasma, the time of plasma excitation OFF is recorded.

The execution time 216 is a difference between the processing end time and the processing start time.

The idle time A is the above-mentioned "idle time between process recipe executions A." The idle time A is a difference between the processing end time of a previous process and the processing start time of a concerned process.

The idle time B is the above-mentioned "idle time between jobs for one lot B." That is, the idle time B is a difference between the end time (not illustrated) for one lot including a process before the concerned process and the start time (not illustrated) for one lot including the concerned process. The idle time B is a time after the MC 60 notifies the EC 301 of the end of a processing for one lot and before the start of a next one lot (e.g., before the MC 60 receives an instruction to start a processing for one lot from the EC 301).

The idle time C is the above-mentioned "idle time between multiple jobs for N lots C." The idle time C is a time after the MC 60 notifies the EC 301 of the end of a processing for N lots and before the EC 301 starts a processing for next N lots (e.g., a user operation to start a processing for N lots).

It can be seen from FIG. 6 that the idle times A to C indicated by reference numerals 220 and 221 are prominently longer than the other idle times.

The idle times A to C indicated by reference numeral 220 are timings at which a processing for N lots ends and a processing for next N lots starts. This can be seen from the fact that the process job ID has been changed. The user instructed the EC 301 to process next N lots "29 minutes and 15 seconds" after a processing for previous N lots ends. Then, "33 minutes and 55 seconds=1 hour and 3 minutes and 10 seconds−29 minutes and 15 seconds" has further passed before the start for a first one lot among next N lots. This is, for example, the time required to move a cassette in which the wafers W to be processed are accommodated. As a result, the idle time between process recipe executions is as long as "1 hour and 50 minutes and 48 seconds."

The idle times A to C indicated by reference numeral 221 are also timings at which a processing for N lots ends and a processing for next N lots starts. Differently, the user instructed the EC 301 to process next N lots immediately (at "0 hours 0 minutes 0 seconds") after a processing for previous N lots ends. However, "59 minutes and 33 seconds" has passed before the start for a first one lot among next N lots. As a result, the idle time between process recipe executions is as long as "1 hour and 40 minutes and 02 seconds."

Accordingly, the user may determine that a trouble affecting the substrate quality have potentially occurred, with reference to the idle times A to C indicated by reference numerals 220 and 221.

Further, the EC 301 may output an alarm when at least one of the three idle times A to C exceeds a threshold value. The EC 301 emphasizes the idle time exceeding the threshold value, for example, by changing the color or brightness of that idle time. Further, the EC 301 may transmit the idle time exceeding the threshold value and the type thereof to a person in charge by e-mail.

Further, the three idle times A to C and, for example, a refractive index (RI) that correlates with the quality of a film may be learned by a method such as machine learning.

[Processing Procedure]

Figure 7:
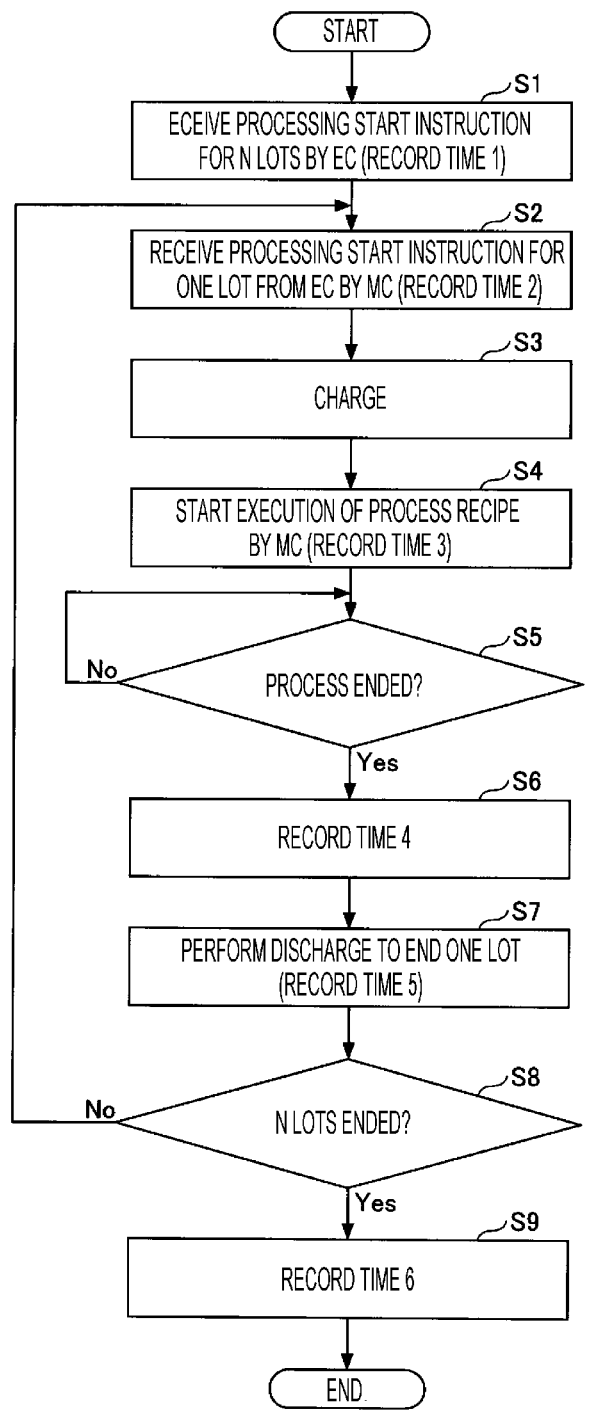
FIG. 7 is an example of a flowchart for explaining a processing of recording the time related to a process, a job, and a control job by the EC according to the present disclosure.

FIG. 7 is an example of a flowchart for explaining a processing of recording the time related to a process, a job, and a processing for N lots by the EC.

The EC 301 receives an instruction to start a processing for N lots, i.e., an execution instruction for a control work, which is transmitted from the host computer 603 (S1). The EC 301 records (stores) Time 1 at which it receives the instruction to start a processing for N lots. "N" corresponding to the number of jobs and the process recipe name may be set by the user, or may be automatically set by the host computer 603.

Subsequently, the EC 301 transmits an execution instruction for each lot to the MC 60. The MC 60 receives the execution instruction for one lot (S2). The EC 301 records (stores), as Time 2, the time at which it transmits the execution instruction for each lot to the MC 60 or the time at which the MC 60 receives the execution instruction for each lot (the time at which the MC 60 sends a notification that it has received the execution instruction to the EC 301).

The MC 60 starts charge for one lot of the wafers W (S3). When the charge ends (when the condition in the processing container becomes suitable for a process), the MC 60 sends a notification that the charge has ended to the EC 301. The EC 301 instructs the MC 60 to start the process recipe, and the MC 60 starts the execution of the process recipe (S4). The MC 60 sends a notification that it has started the process recipe to the EC 301. Thus, the EC 301 records (stores), as Time 3, the processing start time of the process recipe. The MC 60 may start the process recipe without sending the notification that the charge has ended to the EC 301.

The MC 60 executes a substrate processing based on the process recipe. When a process (substrate processing) for one lot ends (Yes in S5), the MC 60 transmits a notification that the process recipe has ended to the EC 301. The EC 301 records (stores), as Time 4, the processing end time of the process (S6).

The EC 301 instructs the MC 60 to start discharge, and the MC 60 performs cooling and performs discharge of one lot of the wafers W to end a processing for one lot (one job) (S7). The MC 60 sends a notification that the processing for one lot has ended to the EC 301. The EC 301 records (stores), as Time 5, the time at which the processing for one lot ends.

The EC 301 determines whether or not a processing for all N lots has ended whenever the processing for one lot ends (S8). When the processing for N lots remains, the EC 301 executes the processing from step S2.

When the processing for all N lots ends, the EC 301 records (stores) Time 6 at which the processing for N lots ends (S9).

With the above, Times 1 to 6 are recorded for N lots. The EC 301 also records Times 1 to 6 for next N lots. Times 3 and 4 are examples of the first history information, Times 2 and 5 are examples of the second history information, and Times 1 and 6 are examples of the third history information.

Figure 8:
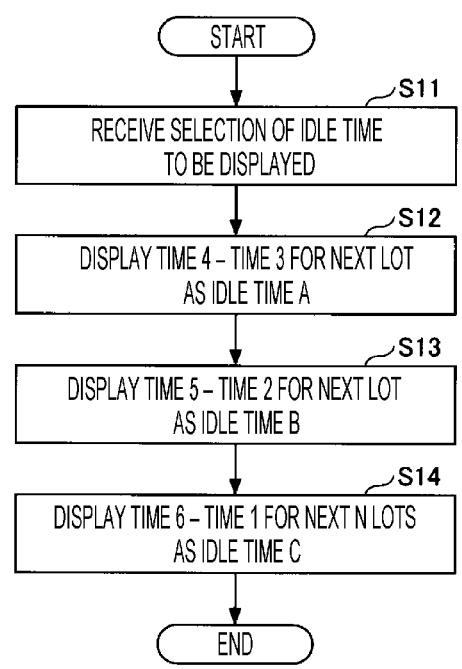
FIG. 8 is an example of a flowchart illustrating a procedure of displaying the idle times by the EC according to the present disclosure.

Then, when the user displays the log screen, the EC 301 displays three idle times (0 to 3 idle times depending on a user operation). FIG. 8 is an example of a flowchart for explaining a display method in which the EC 301 displays the idle times.

When displaying the log screen, the user may set the type of idle time to be displayed on the log screen with the selection screen 201 of FIG. 5. The EC 301 receives the selection of the type of idle time to be displayed (S11). When the user does not set the type of idle time, a default idle time may be displayed. Then, the user instructs the EC 301 to display the log screen 210.

Hereinafter, a case where the EC 301 displays three idle times on the user interface 501 will be described.

The EC 301 displays, as the idle time between process recipe executions, a value obtained by subtracting Time 3 of a process for a next lot from Time 4 of each process (S12).

Further, the EC 301 displays, as the idle time between jobs for one lot, a value obtained by subtracting Time 2 for a next lot from Time 5 for each lot (S13).

Further, the EC 301 displays, as the idle time between multiple jobs for N lots, a value obtained by subtracting Time 1 for next N lots from Time 6 for N lots (S14).

By such a processing, the MC 60 may display the three idle times.

[Main Effect]

As described above, since the EC 301 of the present disclosure displays the idle times, it is possible to reduce the need for the user to read the logs of the plasma processing apparatus 100 with spreadsheet software and to operate a computer. Further, since three different idle times are displayed, the user may consider which idle time affects the substrate quality.

[Others]

Although the plasma processing apparatus 100 has been described above according to the above embodiments, the plasma processing apparatus 100 according to the present disclosure is not limited to the above embodiments, and various modifications and improvements can be made within the scope of the present disclosure. The matters described in the above embodiments can be combined within a consistent range.

In the present disclosure, the wafer W has been described, but a processing target as a plasma processing object is not limited to the wafer W, but may be any one of various substrates used for a liquid crystal display (LCD) and a flat panel display (FPD).

Further, in the present disclosure, an example in which the EC 301 records logs has been described, but the MC 60 may record some or all of the logs.

It is possible for a user to easily grasp the idle state of a substrate processing apparatus.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A control method of a substrate processing apparatus, the method comprising:

storing, in a memory, first history information indicating that a processing is executed by the substrate processing apparatus based on a process recipe;

storing, in the memory, second history information indicating that an execution instruction for a job of the substrate processing apparatus is received to instruct execution of the processing;

storing, in the memory, third history information indicating that an execution instruction for a control job of the substrate processing apparatus is received to instruct collective execution of a plurality of jobs of the substrate processing apparatus;

calculating, based on the first, second and third history information, a first idle time from an end of the processing to a start of a subsequent processing, a second idle time from an end of the job to a start of a subsequent job, and a third idle time from an end of the control job to a start of a subsequent control job;

selecting at least one of the first, second and third idle times;

determining whether the selected at least one of the first, second and third idle times for each processing exceeds a threshold value; and when determined that the selected at least one of the first, second and third idle times for each processing exceeds the threshold value, stopping the substrate processing apparatus and notifying an operator that a trouble has occurred in the substrate processing apparatus.

2. The control method according to claim 1, wherein the processing includes a substrate processing or cleaning.

3. The control method according to claim 1, wherein the first history information includes information regarding a history of plasma excitation ON and plasma excitation OFF, and the first idle time is a time from a plasma excitation OFF to a subsequent plasma excitation ON.

4. The control method according to claim 2, wherein the first history information includes information regarding a history of charging the substrate, processing the substrate, and discharging the substrate, which are performed by the substrate processing apparatus.

5. The control method according to claim 1, wherein the second history information includes a history of receiving the execution instruction for the job from an external computer.

6. The control method according to claim 1, wherein the third history information includes a history of receiving the execution instruction for the control job from an external computer.

7. The control method according to claim 1, wherein the first idle time is calculated by subtracting an end time of the processing from a start time of the subsequent processing, the second idle time is calculated by subtracting an end time of the job from a start time of the subsequent job, and the third idle time is calculated by subtracting an end time of the control job from a start time of the subsequent control job.

8. The control method according to claim 1, wherein the first, second and third idle times are different from each other.

9. The control method according to claim 1, further comprising:

learning the first, second and third idle times and a refractive index that correlates with quality of a film by machine learning.

10. A control apparatus of a substrate processing apparatus, the control apparatus comprising:

a memory; and a processor coupled to the memory and configured to:
store, in the memory, first history information indicating that a processing is executed by the substrate processing apparatus based on a process recipe;
store, in the memory, second history information indicating that an execution instruction for a job of the substrate processing apparatus is received to instruct execution of the processing;
store, in the memory, third history information indicating that an execution instruction for a control job of the substrate processing apparatus is received to instruct collective execution of a plurality of jobs of the substrate processing apparatus;
calculate, based on the first, second and third history information, a first idle time from an end of the processing to a start of a subsequent processing, a second idle time from an end of the job to a start of a subsequent job, and a third idle time from an end of the control job to a start of a subsequent control job;
select at least one of the first, second and third idle times;
determine whether the selected at least one of the first, second and third idle times for each processing exceeds a threshold value; and
when the selected at least one of the first, second and third idle times for each processing exceeds the threshold value, stopping the substrate processing apparatus and notifying an operator that a trouble has occurred in the substrate processing apparatus.

* * * * *